(12) United States Patent
Mishima et al.

(10) Patent No.: US 7,786,509 B2
(45) Date of Patent: Aug. 31, 2010

(54) FIELD-EFFECT TRANSISTOR AND METHOD OF MAKING SAME

(75) Inventors: Tomoyoshi Mishima, Shiki (JP); Toru Nakamura, Mitaka (JP); Masataka Sato, Sagamihara (JP); Kazutaka Nomoto, Minamiashigara (JP)

(73) Assignee: Hitachi Cable, Ltd., Tokyo (JP)

( * ) Notice: Subject to any disclaimer, the term of this patent is extended or adjusted under 35 U.S.C. 154(b) by 152 days.

(21) Appl. No.: 11/902,964

(22) Filed: Sep. 26, 2007

(65) Prior Publication Data

US 2009/0001423 A1 Jan. 1, 2009

(30) Foreign Application Priority Data

Dec. 7, 2006 (JP) .............................. 2006-331076

(51) Int. Cl.
 *H01L 21/338* (2006.01)
(52) U.S. Cl. .............................. 257/194; 257/E21.403; 257/E29.246; 257/E29.252; 438/172
(58) Field of Classification Search .......... 257/E21.403, 257/E29.246, E29.252, 194; 438/172
See application file for complete search history.

(56) References Cited

U.S. PATENT DOCUMENTS 5,821,577 A * 10/1998 Crabbe' et al. .............. 257/288

7,419,892 B2 * 9/2008 Sheppard et al. ............ 438/522

FOREIGN PATENT DOCUMENTS

JP 10-223653 A 8/1998

* cited by examiner

*Primary Examiner*—Matthew C Landau
*Assistant Examiner*—Jessica Hall
(74) *Attorney, Agent, or Firm*—Foley & Lardner LLP

(57) ABSTRACT

A field-effect transistor is composed of a substrate, an electron transport layer and an electron supply layer formed sequentially on the substrate, wherein the electron transport layer and the electron supply layer are formed of a nitride semiconductor, a gate electrode, a source electrode and a drain electrode formed on the electron supply layer; and two high impurity concentration regions located in a depth direction directly below the source electrode and the drain electrode, respectively, the two high impurity concentration regions being formed to sandwich a two-dimensional electron gas layer formed between the electron transport layer and the electron supply layer. The two high impurity concentration regions each have a higher impurity concentration than the electron transport layer and the electron supply layer located directly below the gate electrode.

9 Claims, 2 Drawing Sheets

7 FIRST HIGH-CONCENTRATION REGION
8 SECOND HIGH-CONCENTRATION REGION
9 TWO-DIMENSIONAL ELECTRON GAS LAYER

7 FIRST HIGH-CONCENTRATION REGION
8 SECOND HIGH-CONCENTRATION REGION

7 FIRST HIGH-CONCENTRATION REGION
8 SECOND HIGH-CONCENTRATION REGION
9 TWO-DIMENSIONAL ELECTRON GAS LAYER

FIELD-EFFECT TRANSISTOR AND METHOD OF MAKING SAME

The present application is based on Japanese patent application No. 2006-331076, the entire contents of which are incorporated herein by reference.

BACKGROUND OF THE INVENTION

1. Field of the Invention

This invention relates to a field-effect transistor formed in a nitride based compound semiconductor and, in particular, to a field-effect transistor that can be designed to be significantly low in source and drain parasitic resistance values, very high in drain saturation current, and very high in transconductance. Also, this invention relates to a fabrication method for the field-effect transistor.

2. Description of the Related Art

Wide bandgap nitride based compound semiconductors such as GaN, AlGaN and GaInN attract attention as a material for the field-effect transistor including a high-voltage and high-output HEMT (high-electron-mobility transistor).

Semiconductor devices generally include an ohmic electrode and a non-ohmic electrode.

In general, when a field-effect transistor is fabricated by using a wide bandgap system semiconductor crystal, for example, by forming on a sapphire substrate an undoped GaN layer as an electron transport layer (or channel layer) and a high-resistivity or n-type AlGaN as an electron supply layer on which a source electrode and a drain electrode are formed, the series resistance of these ohmic electrodes will increase to reduce the performance.

JP-A-10-223653 discloses a recess type field-effect transistor that a high-concentration region is formed by ion implantation of Si etc. as well as an electronic device formation epitaxial crystal growth method etc., and that an electrode is formed on the high-concentration region to reduce the series resistance of the ohmic electrode.

However, since the recess type field-effect transistor needs the formation of a non-ohmic electrode, it is necessary to remove a part of the high-concentration region by etching etc. in order to secure a region where to form the electrode. This may cause increased unevenness on the surface of the field-effect transistor as well as difficulty in the fabrication process, which are significantly disadvantageous in wiring an electrode etc.

SUMMARY OF THE INVENTION

It is an object of the invention to provide a field-effect transistor, formed in a wide band gap system semiconductor crystal, that has an ohmic electrode with significantly reduced series resistance to enhance the performance.

It is a further object of the invention to provide a fabrication method for the field-effect transistor.

(1) According to one embodiment of the invention, a field-effect transistor comprises:

a substrate;

an electron transport layer and an electron supply layer formed sequentially on the substrate, wherein the electron transport layer and the electron supply layer comprise a nitride semiconductor;

a gate electrode, a source electrode and a drain electrode formed on the electron supply layer; and two overlapping high impurity concentration regions located in a depth direction directly below the source electrode and the drain electrode, respectively, the two high impurity concentration regions being formed to sandwich a two-dimensional electron gas layer formed between the electron transport layer and the electron supply layer, wherein the two high impurity concentration regions each comprise a higher impurity concentration than the electron transport layer and the electron supply layer located directly below the gate electrode, and the electron supply layer comprises a substantially flat surface between the source electrode and the gate electrode and between the drain electrode and the gate electrode.

In the above embodiment (1), the following modifications, changes and a combination thereof can be made.

(i) The two high impurity concentration regions comprises a first high concentration region formed in the electron supply layer and a second high concentration region formed in the electron transport layer, the first high concentration region comprises a carrier concentration of $1 \times 10^{18}$ to $10^{20}$ cm$^{-3}$, the second high concentration region comprises a carrier concentration of $1 \times 10^{18}$ to $10^{19}$ cm$^{-3}$, and the first high concentration region comprises a higher carrier concentration than the second high concentration region.

(2) According to another embodiment of the invention, a method of making a field-effect transistor comprises:

forming an electron transport layer and an electron supply layer sequentially on a substrate, wherein the electron transport layer and the electron supply layer comprise a nitride semiconductor;

forming a gate electrode, a source electrode and a drain electrode on the electron supply layer; and implanting an impurity into the electron transport layer and the electron supply layer located directly below the source electrode and the drain electrode in two stages to form two overlapping high impurity concentration regions in a depth direction directly below the source electrode and the drain electrode such that the two high impurity concentration regions sandwich a two-dimensional electron gas layer formed between the electron transport layer and the electron supply layer, wherein the two high impurity concentration regions each comprise a higher impurity concentration than the electron transport layer and the electron supply layer located directly below the gate electrode.

In the above embodiment (2), the following modifications, changes and a combination thereof can be made.

(ii) The two high impurity concentration regions comprises a first high concentration region formed in the electron supply layer and a second high concentration region formed in the electron transport layer, and the impurity implanting comprises implanting impurity ions at a predetermined accelerating energy and dose such that the first high concentration region comprises a carrier concentration of $1 \times 10^{18}$ to $10^{20}$ cm$^{-3}$, the second high concentration region comprises a carrier concentration of $1 \times 10^{18}$ to $10^{19}$ cm$^{-3}$, and the first high concentration region comprises a higher carrier concentration than the second high concentration region.

ADVANTAGES OF THE INVENTION

According to the invention, the first and second high-concentration regions are formed in the electron supply layer and the electron transport layer, respectively, formed below the source electrode and the drain electrode, respectively, as ohmic electrodes. Thereby, the electrodes can be provided with significantly low series resistance. By using the ion implantation process, a field-effect transistor can be fabricated such that it has substantially the flat surface while reducing the unevenness on the surface thereof.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

A preferred embodiment according to the invention will be described below with reference to the attached drawings.

The invention can be achieved by forming selectively a high-concentration layer only under an electrode when forming the ohmic electrode used for a field-effect transistor.

The embodiment will be detailed below.

Figure 1:
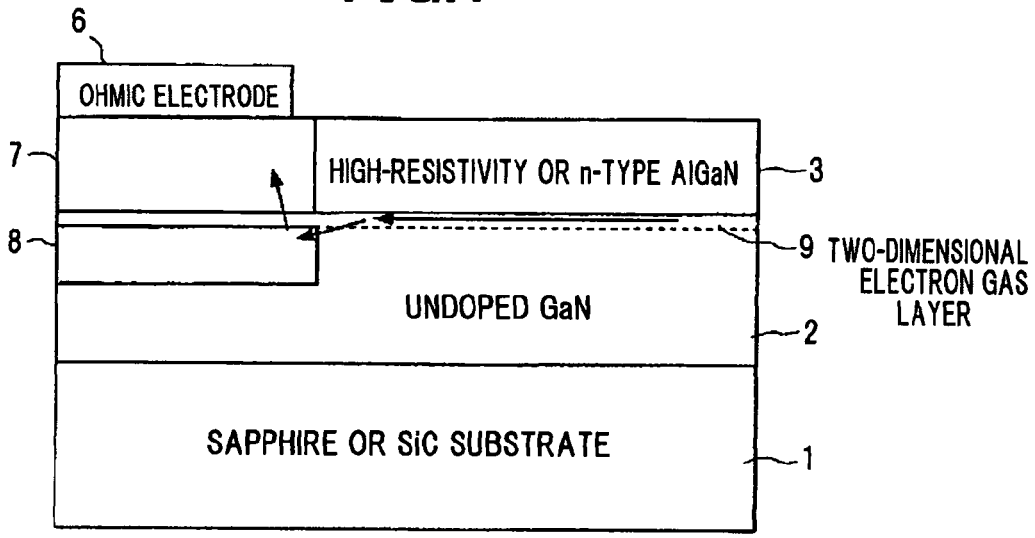
FIG. 1 is a schematic cross sectional view showing a field-effect transistor in a preferred embodiment according to the invention.

As shown in FIG. 1, an undoped GaN layer 2 as an electron transport layer is formed on a sapphire ($Al_2O_3$) or silicon carbide (SiC) substrate by MOCVD (metalorganic chemical vapor deposition). Then, a high-resistivity or n-type AlGaN layer 3 is formed thereon, where a two-dimensional electron gas layer 9 is formed at an interface therebetween.

By using the two-dimensional electron gas layer 9, the field-effect transistor can be formed.

Since the AlGaN layer 3 has high resistivity, it yields high resistance to an ohmic electrode (=drain electrode) 6 deposited on the surface thereof.

However, by forming a first high-concentration region 7 in the high-resistivity or n-type AlGaN layer 3 by ion implantation, the contact resistance between the high-concentration region 7 and the electrode 6 becomes significantly small.

Further, when a second high-concentration region 8 is formed deeper than the AlGaN/GaN interface, the second high-concentration region 8 can be formed selectively in the undoped GaN layer 2 to reduce the sheet resistance. Therefore, electrons flowing along the two-dimensional electron gas layer 9 at the AlGaN/GaN interface can, as shown by arrows in FIG. 1, pass through only the high-concentration regions 8 and 9 to reduce the resistance to the ohmic electrode 6.

Figure 2:
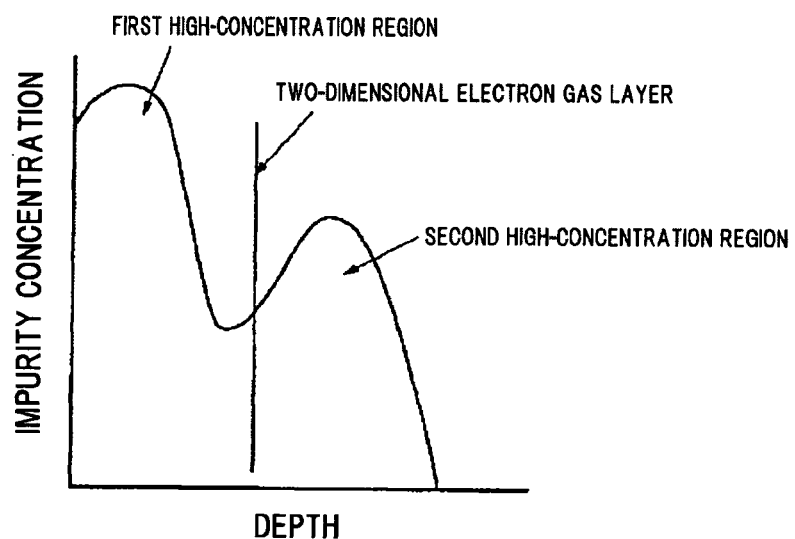
FIG. 2 is a graph showing a distribution of impurity concentration in the depth direction to allow a low-resistivity ohmic electrode according to the invention.

FIG. 2 shows a distribution of impurity concentration in the depth direction directly below the ohmic electrode. As shown, the first high-concentration region 7 with a peak carrier concentration value of $1 \times 10^{18}$ to $10^{20}$ $cm^{-3}$ is formed in the high-resistivity or n-type AlGaN layer 3, and the second high-concentration region 8 with a peak carrier concentration value of $1 \times 10^{18}$ to $10^{19}$ $cm^{-3}$ is formed via the two-dimensional electron gas layer 9.

Figure 3:
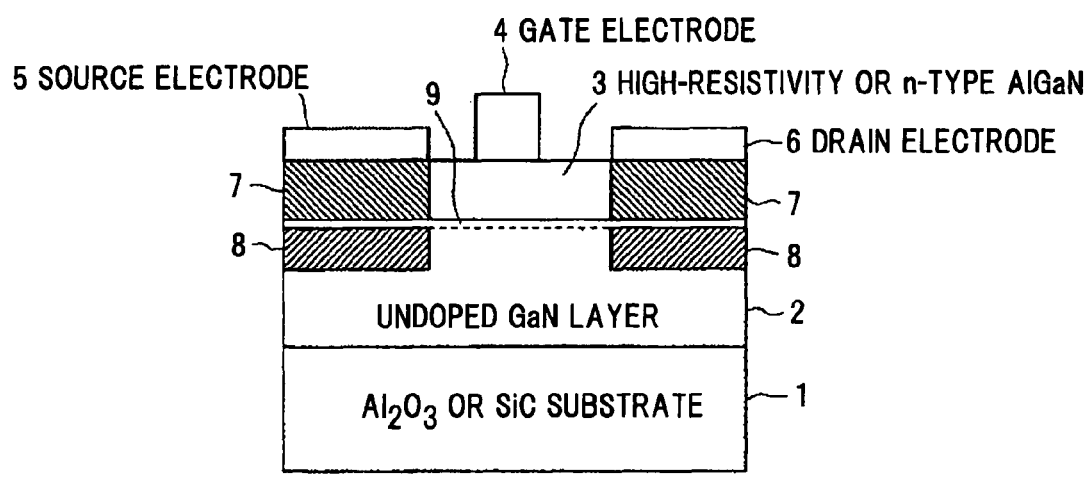
FIG. 3 is a schematic cross sectional view showing an example of a field-effect transistor according to the invention.

As described above, in this embodiment, the high-concentration regions 8, 9 of Si etc. are formed in the high-resistivity or n-type AlGaN layer 3, as an electron supply layer, and in the undoped GaN layer 2 as an electron transport layer, respectively, which are formed directly below the source electrode 5 (or drain electrode 6) as an ohmic electrode. Further, by forming a gate electrode 4 (See FIG. 3) in the AlGaN layer 3, the electrodes 4, 5 and 6 can be formed on the same plane.

Thus, unevenness on the surface of the conventional recess type field-effect transistor can be eliminated. Therefore, the wiring of electrode can be facilitated and the high performance field-effect transistor can be obtained.

An example of a field-effect transistor according to the invention will be described below.

A wafer is prepared by using the known MOCVD, where the undoped GaN layer 2 with a thickness of 2000 nm and the high-resistivity or n-type AlGaN layer 3 with a thickness of 30 nm are sequentially grown on the sapphire or semiconductive SiC substrate 1.

Used as source gasses are trimethylgallium, trimethylaluminum, ammonia and disilane which are used generally. The growth temperature and pressure are 1100° C. and a normal pressure, respectively. The electrical conductivity of the wafer is measured about 500 ohms as sheet resistance.

Then, silicon ions are implanted to a position where to form the source electrode 5 and the drain electrode 6 in two stages, i.e., at an accelerating energy of 80 keV and a dose of 1E15 $cm^{-2}$, and at an accelerating energy of 30 keV and a dose of 1E15 $cm^{-2}$. Then, the wafer is heated at 1200° C. in a nitrogen atmosphere.

Then, the NiAu gate electrode 4, the TiAl source electrode 5 and the TiAl drain electrode 6 are formed.

The performance comparison results of the field-effect transistor (example) thus fabricated to the conventional recess type field-effect transistor are as follows. In this example, the turn-on resistance is reduced to about one fourth, the saturated drain current is increased to about four times, the transconductance is increased to about two times, and the cutoff frequency is increased to about four times. These improvements are caused by that the series resistance of the source electrode and the drain electrode as ohmic electrodes is each reduced to about one tenth.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, the setting values in the above embodiment and example are only for exemplification and may be changed into different values if necessary. Although in the above embodiment and example, first and second high-concentration regions are overlapped with each other, they may be positioned not overlapped, where the same effects can be obtained.

What is claimed is:

1. A field-effect transistor, comprising:
   a substrate;
   an electron transport layer and an electron supply layer formed sequentially on the substrate, wherein the electron transport layer and the electron supply layer comprise a nitride semiconductor;
   a gate electrode, a source electrode and a drain electrode formed on the electron supply layer; and
   two overlapping high impurity concentration regions located in a depth direction directly below the source electrode and the drain electrode, respectively, the two high impurity concentration regions being formed to sandwich a two-dimensional electron gas layer formed between the electron transport layer and the electron supply layer,
   wherein the two high impurity concentration regions comprising a first high concentration region formed in the electron supply layer and a second high concentration region formed in the electron transport layer, wherein the first high concentration region comprises a peak carrier concentration of $1\times10^{18}$ to $10^{20}$ cm$^{-3}$, wherein the second high concentration region comprises a peak carrier concentration of $1\times10^{18}$ to $10^{19}$ cm$^{-3}$, wherein the first and second high concentration regions each comprise a higher impurity concentration than the electron transport layer and the electron supply layer located directly below the gate electrode, and the electron supply layer comprises a substantially flat surface between the source electrode and the gate electrode and between the drain electrode and the gate electrode.

2. The field-effect transistor according to claim 1, wherein:

the first high concentration region comprises a higher carrier concentration than the second high concentration region.

3. A method of making a field-effect transistor, comprising:

forming an electron transport layer and an electron supply layer sequentially on a substrate, wherein the electron transport layer and the electron supply layer comprise a nitride semiconductor;

forming a gate electrode, a source electrode and a drain electrode on the electron supply layer; and implanting an impurity into the electron transport layer and the electron supply layer located directly below the source electrode and the drain electrode in two stages to form two overlapping high impurity concentration regions in a depth direction directly below the source electrode and the drain electrode such that the two high impurity concentration regions sandwich a two-dimensional electron gas layer formed between the electron transport layer and the electron supply layer, wherein the two high impurity concentration regions comprising a first high concentration region formed in the electron supply layer and a second high concentration region formed in the electron transport layer, wherein the first high concentration region comprises a peak carrier concentration of $1\times10^{18}$ to $10^{20}$ cm$^{-3}$, wherein the second high concentration region comprises a peak carrier concentration of $1\times10^{18}$ to $10^{19}$ cm$^{-3}$, wherein the first and second high-concentration regions each comprise a higher impurity concentration than the electron transport layer and the electron supply layer located directly below the gate electrode.

4. The method according to claim 3, wherein:

the impurity implanting comprises implanting impurity ions at a predetermined accelerating energy and dose such that the first high concentration region comprises a higher carrier concentration than the second high concentration region.

5. The field-effect transistor according to claim 1, wherein the second high concentration region is formed deeper than an interface between the electron transport layer and the electron supply layer.

6. The field-effect transistor according to claim 1, wherein the peak concentration of the first high concentration region is separated from the peak concentration of the second high concentration region.

7. The method according to claim 3, wherein the second high concentration region is formed deeper than an interface between the electron transport layer and the electron supply layer.

8. The method according to claim 3, wherein an accelerating energy in the ion implanting is changed between the two stages.

9. The method according to claim 3, wherein the peak concentration of the first high concentration region is separated from the peak concentration of the second high concentration region.

* * * * *